(12) United States Patent
Bauer et al.

(10) Patent No.: US 9,203,375 B2
(45) Date of Patent: Dec. 1, 2015

(54) BAND REJECTION FILTER COMPRISING A SERIAL CONNECTION OF AT LEAST TWO PI-ELEMENTS

(75) Inventors: Thomas Bauer, München (DE); Matthias Jungkunz, München (DE)

(73) Assignee: EPCOS AG, Munich (DE)

( * ) Notice: Subject to any disclaimer, the term of this patent is extended or adjusted under 35 U.S.C. 154(b) by 243 days.

(21) Appl. No.: 13/880,044

(22) PCT Filed: Oct. 17, 2011

(86) PCT No.: PCT/EP2011/068132
§ 371 (c)(1),
(2), (4) Date: Jul. 1, 2013

(87) PCT Pub. No.: WO2012/052414
PCT Pub. Date: Apr. 26, 2012

(65) Prior Publication Data
US 2013/0271242 A1    Oct. 17, 2013

(30) Foreign Application Priority Data
Oct. 20, 2010   (DE) .......................... 10 2010 048 965

(51) Int. Cl.
*H03H 9/46* (2006.01)
*H03H 9/54* (2006.01)
(Continued)

(52) U.S. Cl.
CPC .............. *H03H 9/54* (2013.01); *H03H 9/0542* (2013.01); *H03H 9/568* (2013.01); *H03H 9/6483* (2013.01)

(58) Field of Classification Search
CPC ........... H03H 9/00; H03H 9/10; H03H 9/145; H03H 9/64

USPC .......................................... 333/133, 193–196
See application file for complete search history.

(56) References Cited

U.S. PATENT DOCUMENTS 4,803,449 A   2/1989   Hikita et al.
5,854,579 A   12/1998  Penunuri
(Continued)

FOREIGN PATENT DOCUMENTS

CN   1630980 A    6/2005
DE   10057848 A1  5/2002
(Continued)

OTHER PUBLICATIONS

Aliouane, S. et al.: "RF-MEMS Switchable Inductors for Tunable Bandwidth BAW Filters", International Conference on Design & Technology of Integrated Systems in Nanoscale Era, 2010, pp. 1-6.
(Continued)

*Primary Examiner* — Dean Takaoka
(74) *Attorney, Agent, or Firm* — McDermott Will & Emery LLP

(57) ABSTRACT

The invention relates to a band rejection filter comprising a piezoelectric substrate and a serial connection of at least two pi-elements which are arranged on the substrate. The pi-elements respectively comprise at least two electro-acoustic parallel resonators and at least one electro-acoustic serial resonator, and are connected by a first series inductance. Said serial connection comprises, on a first inlet, a second series inductance and on an outlet, a third series inductance. Said resonators have a pole-zero plot of approximately 9% or more.

18 Claims, 5 Drawing Sheets

(51) Int. Cl.
    *H03H 9/05*     (2006.01)
    *H03H 9/56*     (2006.01)
    *H03H 9/64*     (2006.01)

(56) References Cited

U.S. PATENT DOCUMENTS

| | | | |
|---|---|---|---|
| 6,747,530 B1 * | 6/2004 | Selmeier | 333/193 |
| 6,924,715 B2 * | 8/2005 | Beaudin et al. | 333/133 |
| 6,967,546 B2 * | 11/2005 | Nakatani et al. | 333/193 |
| 7,042,132 B2 | 5/2006 | Bauer et al. | |
| 7,479,848 B2 | 1/2009 | Kuroda | |
| 7,719,388 B2 * | 5/2010 | Schmidhammer | 333/187 |
| 7,876,179 B2 | 1/2011 | Bauer et al. | |
| 8,508,316 B2 * | 8/2013 | Link | 333/189 |
| 2003/0080831 A1 * | 5/2003 | Naumenko et al. | 333/193 |
| 2004/0090145 A1 | 5/2004 | Bauer et al. | |
| 2004/0263286 A1 * | 12/2004 | Unterberger | 333/187 |
| 2009/0256649 A1 * | 10/2009 | Taniguchi | 333/186 |
| 2010/0127799 A1 * | 5/2010 | Bauer et al. | 333/195 |
| 2010/0188165 A1 * | 7/2010 | Nakamura et al. | 333/124 |
| 2011/0090026 A1 * | 4/2011 | Nakahashi et al. | 333/195 |
| 2012/0286895 A1 * | 11/2012 | Hara et al. | 333/133 |

FOREIGN PATENT DOCUMENTS

| | | |
|---|---|---|
| DE | 10111959 A1 | 9/2002 |
| DE | 102005051852 A1 | 5/2007 |
| EP | 1398876 A1 | 3/2004 |
| EP | 1944867 A1 | 7/2008 |
| EP | 1976116 A1 | 10/2008 |
| EP | 1986320 A1 | 10/2008 |
| EP | 2093881 A1 | 8/2009 |
| EP | 2299595 A1 | 3/2011 |
| EP | 2416496 A1 | 2/2012 |
| JP | 10065489 A | 3/1998 |
| JP | 2003332881 A | 11/2003 |
| WO | 02/073800 A1 | 9/2002 |
| WO | 03/069777 A1 | 8/2003 |
| WO | 2007/048376 A1 | 5/2007 |
| WO | 2007/052483 A1 | 5/2007 |
| WO | 2010/001522 A1 | 1/2010 |
| WO | 2010/116776 A1 | 10/2010 |
| WO | WO 2012084460 A1 * | 6/2012 |

OTHER PUBLICATIONS

Liu, J. et al.: "Saw Antenna Duplexer for Trunking Communication", IEEE Ultrasonics Symposium, 2004, pp. 1521-1524.

* cited by examiner

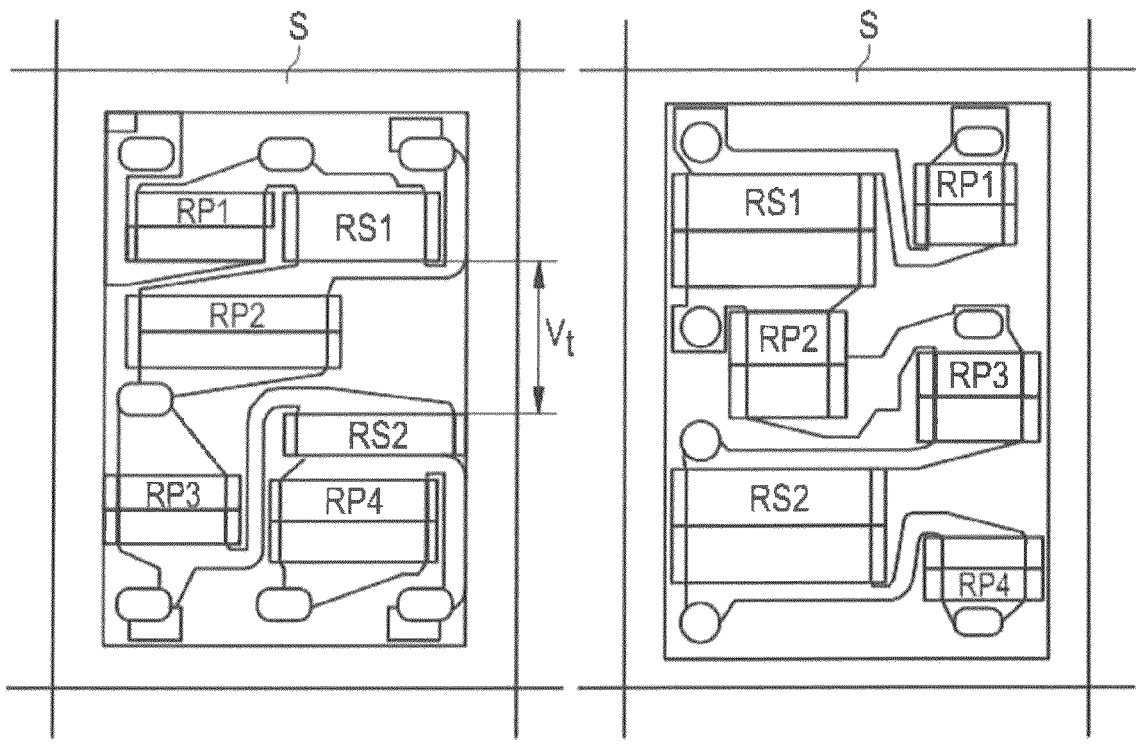

BAND REJECTION FILTER COMPRISING A SERIAL CONNECTION OF AT LEAST TWO PI-ELEMENTS

TECHNICAL FIELD

The present invention relates to a band rejection filter comprising a piezoelectric substrate and comprising a serial connection of at least two pi-elements arranged on the substrate, according to claim 1.

BACKGROUND

Band rejection filters are required for suppressing undesirable frequency bands. Such filters can advantageously be used, for example, if, in the case of two frequency bands that are close together in a wireless transmission standard, one of the two bands is intended to be masked out. Ideally, the passband of the filter should have at least the bandwidth of the system to be received and should generate only a low insertion loss there. In the stop band, such a filter should have a high attenuation and ideally have a fast transition from passband to stop band, that is to say a steep edge of the passband.

Filters based on combinations of coils and capacitors are known, which, however, require an extremely high quality factor of the elements and high filter degrees in order to satisfy the requirements provided in respect of bandwidth, insertion loss and rejection performance. Moreover, it is virtually impossible to realize such filters cost-effectively and in a small fashion.

Band rejection filters are known, for example from the documents EP 2093881 A1, WO 2010/001522, EP 1976116 A1, EP 1986320 A1 and EP 1944867 A1.

Furthermore, SAW filters comprising resonators as a band rejection filter are known. By way of example, the document U.S. Pat. No. 4,803,449 describes a ladder arrangement comprising SAW resonators in series branches or parallel branches. Parallel resonators comprising series inductances are known, for example, in the document EP 1398876 A1.

SUMMARY

The invention is based on the object of specifying a band rejection filter which is distinguished by a high bandwidth in the passband with low insertion loss and at the same time rejection with high power to be blocked. Moreover, the invention is based on the object of specifying a cost-effective and miniaturized band rejection filter.

These objects are achieved, inter alia, by means of a band rejection filter comprising the features of claim 1. The dependent claims relate to advantageous embodiments of the band rejection filter.

A band rejection filter is specified which comprises a piezoelectric substrate and a serial connection of at least two pi-elements which are arranged on the substrate. The pi-elements each comprise at least two electro-acoustic parallel resonators and at least one electro-acoustic series resonator. The pi-elements are connected by a first series inductance. The serial connection of the pi-elements has a second series inductance at an input and a third series inductance at an output. The resonators have a pole-zero spacing of approximately 9% or more.

A band rejection filter embodied in this way allows the specification provided to be fulfilled with a minimal number of high-quality and expensive external coils. An improved band rejection filter having a minimal number of external inductances can thus be obtained. Moreover, such a band rejection filter has a very high bandwidth in the passband with low insertion loss, for example in the passband of one or more mobile radio bands or broadcast bands, and at the same time a high suppression in selected frequency bands. Preferably, a wide passband in the UHF band range and a selection in the VHF band and for the 1 and 2 GHz mobile radio bands are ensured.

The resonators have a pole-zero spacing of 9% or more. If resonators having a pole-zero spacing in this range are used, the desired requirements can advantageously be satisfied with a minimal number of external coils and external resonators. The band rejection filter thus has the required bandwidth in the passband with low insertion loss and also a stop band with high power to be blocked. Moreover, the band rejection filter can be produced cost-effectively in this way.

In one embodiment, the band rejection filter has a width of more than 40% in the passband. Such extremely high bandwidths in the UHF passband with low insertion loss are necessary, in particular, in television applications, for example in cellphones.

In one embodiment, the resonators are SAW resonators. With SAW resonators (SAW: surface acoustic wave), it is possible to realize filters for RF signals with the aid of the piezoelectric effect and electro-acoustic conversion. In this case, a SAW resonator comprises, on a piezoelectric single crystal, at least one pair of electrodes which intermesh in a comb-type manner and which together form a transducer (IDT: interdigital transducer).

In one embodiment, the resonators are SAW resonators, wherein a dielectric layer for passivation is applied to the SAW IDT structures. The dielectric layer can simultaneously serve for temperature compensation.

In one embodiment, the substrate comprises LiNbO3 with 41YX cut. As a result, for the same transmission in the UHF passband, it is possible to obtain a selectivity in the stop band that is higher by at least 10 dB. Substrates based on such a material are advantageous, in particular, for suppressing mobile radio bands, such as, for example, GSM850 Tx and GSM900 Tx.

Alternatively, the substrate can comprise LiNbO3 with 15YX cut and the resonators can comprise a metallization structure composed, for example, of Al or AlCuAl with a metallization ratio of 0.4-0.6. In this case the relative metallization height is between 2% and 4%.

In one embodiment, the substrate comprises LiNbO3 YX with a cut angle of between 45° and 0°.

In one embodiment, the band rejection filter additionally comprises a housing, in which the substrate with pi-elements arranged thereon is integrated. The band rejection filter is therefore accommodated in the housing and protected by the latter against mechanical influences.

In one embodiment, the housing is a 10-pin housing. The band rejection filter can therefore be integrated into known 10-pin housings, as a result of which a special housing development is not necessary. In particular, a band rejection filter embodied in this way requires only a number of insulated connections in the housing sufficient to enable said filter already to be incorporated into 10-pin housings used for 2-in-1 filters.

In one embodiment, the housing is a 5-pin housing.

In one embodiment, the stop band of the band rejection filter has in total a relative bandwidth of more than 10%. In particular, a plurality of rejections of a plurality of wide 1-GHz mobile radio bands with high power to be blocked can be obtained by means of the band rejection filter. A moderate selectivity in the VHF III band and a high selectivity for the 2 GHz mobile radio bands are obtained in this case.

In one embodiment, the parallel resonators are embodied as SAW resonators without reflectors. On account of the omission of the reflectors in the parallel resonators, the basic area of such band rejection filters is advantageously reduced, wherein the performance is also increased at the same time. Miniaturized band rejection filters can thus be realized.

Problems with undesirable resonances at the reflector/transducer transition can alternatively be avoided by using resonators that are as synchronous as possible. In the case of a synchronous resonator, in particular all reflector and transducer fingers lie on a periodic grid and are approximately of the same width.

In one embodiment, the series resonators are embodied as SAW resonators without reflectors. The avoidance of resonances, as described above, is thus also made possible in the series resonators.

In one embodiment, the resonators are at least partly cascaded. The use of cascades advantageously leads to an increase in performance and a reduction of the insertion loss or of the ripple in the passband. Such a cascading of resonators is known, for example, from the document DE 100 57 848 A1, the disclosure content of which is hereby incorporated by reference.

In one embodiment, distances between adjacent electrode fingers of at least one parallel resonator embodied as a SAW resonator vary over the length of the resonator. An improvement in the selectivity in the stop band can be obtained as a result. Such a variation of the adjacent electrode fingers is known to the person skilled in the art, for example, from the document DE 101 11 959 A1, the disclosure content of which is hereby incorporated by reference.

In one embodiment, a further parallel resonator in a parallel branch connected relative to ground is provided at the input and at the output of the serial connection. Consequently, a respective additional parallel resonator is used at the input and output of the filter, as a result of which, for example, a filter degree of 10 has to be used. In this case, the filter requirements can also be achieved with resonators having a smaller pole-zero spacing of, for example, approximately 5.5%, although at the expense of the complexity of the connection.

Further parallel resonators of this type are known, for example, from the document EP 2093881 A1, the disclosure content of which is hereby explicitly incorporated by reference in the present application.

In one embodiment, the series resonator of the first pi-element is arranged on the substrate in a manner offset in a transverse direction relative to the series resonator of the second pi-element, such that acoustic waves which leave the first series resonator cannot impinge on the second series resonator and thus reduce the selection in the stop bands.

Likewise, the parallel resonators of the first pi-element can be arranged on the substrate in a manner offset in a transverse direction relative to the parallel resonators of the second pi-element.

In one embodiment, the resonant frequencies of the parallel resonators are higher than the resonant frequencies of the series resonators.

A band rejection filter, as described above, is preferably used in a communication device for mobile radio, which is additionally designed for reception in a frequency band that transmits video and/or audio data. Precisely such applications require band rejection filters having a high bandwidth in the passband with low insertion loss and high suppression in selected frequency bands, such as in mobile radio bands, for example.

BRIEF DESCRIPTION OF THE DRAWINGS

Further features, advantages, embodiments and expediencies of the band rejection filter will become apparent from the exemplary embodiments explained below in conjunction with the figures, in which.

DETAILED DESCRIPTION

Identical or identically acting constituent parts are in each case provided with the same reference signs. The illustrated constituent parts and the size relationships of the constituent parts among one another should not be regarded as true to scale.

Figure 1:
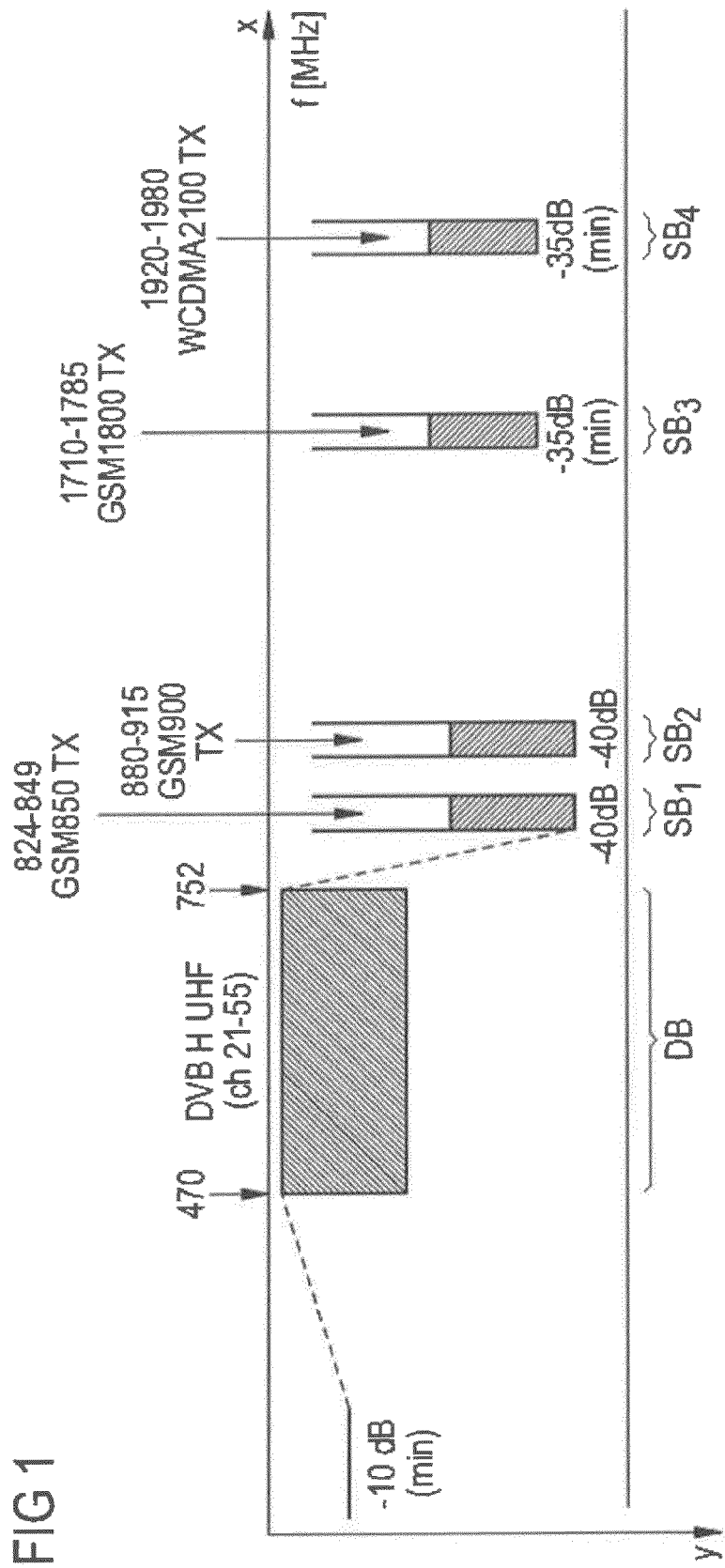
FIG. 1 shows a specification of an exemplary embodiment of a band rejection filter according to the invention.

FIG. 1 shows a specification of an exemplary embodiment of a band rejection filter. In the specification, the frequency in MHz is plotted along the X-axis. The attenuation of the band rejection filter in dB is plotted along the Y-axis.

The band rejection filter has a high bandwidth of approximately 47% in the passband DB. The passband is approximately in a range of between 470 MHz and 752 MHz. The passband DB thus has a width of approximately 282 MHz. Preferably, the passband is in the UHF band and has a low insertion loss. In the present exemplary embodiment, the insertion loss is −2 dB, for example.

The specification furthermore has a plurality of stop bands SB1, SB2, Sb3, SB4, which have in total when strung together approximately a width of 1 GHz. The present first stop band SB1 is in the frequency range of between 824 MHz and 849 MHz. This range corresponds to the mobile radio band GSM 850 Tx.

The second stop band SB2 is in a frequency range of between 880 MHz and 915 MHz and thus corresponds to the mobile radio band GSM900 Tx. The first stop band SB1 and the second stop band SB2 each have approximately an attenuation of approximately −40 dB.

The third stop band SB3 is in a frequency range of 1710 MHz to 1785 MHz; this corresponds to the GSM1800 Tx range. The fourth stop band SB4 is in the frequency range of between 1920 MHz and 1980 MHz, that is to say in the WCDMA2100 Tx range. The third stop band SB3 and the fourth stop band SB4 have an attenuation of approximately −35 dB.

Figure 2A:
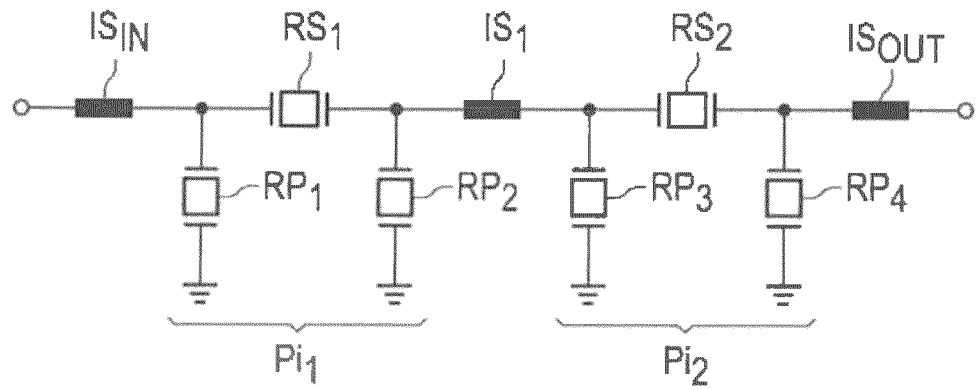
FIG. 2A shows an exemplary embodiment of a band rejection filter according to the invention.

FIG. 2A illustrates a circuit diagram of one possible exemplary embodiment of a band rejection filter. The latter comprises a serial connection of at least two pi-elements Pi1, Pi2 on a piezoelectric substrate. The first pi-element Pi1 has two electro-acoustic parallel resonators RP1, RP2 and one electro-acoustic series resonator RS1. The second pi-element Pi2 has two electro-acoustic parallel resonators RP3, RP4 and one electro-acoustic series resonator RS2. The pi-elements Pi1, Pi2 are connected by a first series inductance IS1. The serial connection of the pi-elements PI1, PI2 has a second series inductance ISIN at an input and a third series inductance ISOUT at an output. The individual resonators of the band rejection filter have a pole-zero spacing of approximately 10% or more. The resonators are SAW resonators, for example.

The filter is embodied, for example, on a lithium niobate substrate with a metallization structure composed, for example, of Al, AlCuAl or TiCuAl.

A filter degree of 8 can be obtained in the exemplary embodiment illustrated in FIG. 2A. This configuration can be accommodated in known 2-in-1 10-pin housings, such that housing development is not required. The resonators are realized here on a substrate comprising, for example, LiNbO3 41YX or LiNbO3 0YX. The substrate with the pi-elements arranged thereon is subsequently integrated in the 10-pin housing.

A band rejection filter according to FIG. 2A allows the specification illustrated in FIG. 1 to be fulfilled with a minimal number of high-quality, hence expensive, external coils. In order to increase the performance and reduce the insertion loss or the ripple in the passband, the use of cascades is advantageous. The parallel and/or series resonators RP1, RP2, RP3, RP4, RS1 and RS2 can therefore have in part a cascading.

For the miniaturized configuration of the band rejection filter, the reflectors can be omitted in the parallel resonators RP1, RP2, RP3, RP4 or in the series resonators RS1, RS2. This advantageously increases the performance, too.

Moreover, distances between adjacent electrode fingers of a parallel resonator RP1, RP2, RP3, RP4 embodied as a SAW resonator can vary over the length of the resonator. This advantageously improves the selection in the stop band.

In the present case, the resonant frequencies of the parallel resonators RP1, RP2, RP3, RP4 are higher than the resonant frequencies of the series resonators RS1, RS2. Preferably, the series resonator (RS1) of the first pi-element (Pi1) is offset (not illustrated) in a transverse direction relative to the series resonator (RS2) of the second pi-element (Pi2). An occurrence of acoustic coupling of the series resonators RS1, RS2 of the pi-elements Pi1, Pi2 can be avoided on account of this offset, as a result of which it is possible to obtain a high gain in selection in the band rejection filter.

Figure 2B:
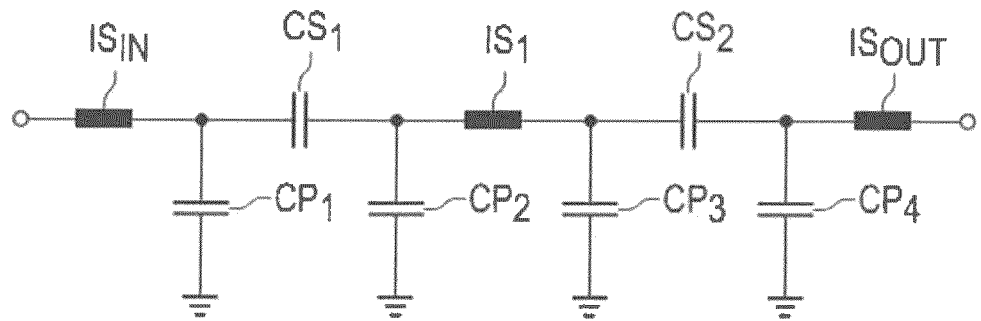
FIG. 2B shows the exemplary embodiment from FIG. 2A, wherein, for elucidating the arising of the passband, the resonators are replaced by their static capacitances.

In FIG. 2B, for the purpose of elucidating the filter function, the resonators RS1, RS2, RP1, RP2, RP3, RP4 of the band rejection filter according to FIG. 2A are replaced by their static capacitances CS1, CS2, CP1, CP2, CP3, CP4. It is thus possible to obtain a selection in the VHF and 2 GHz frequency range, and also the wide passband.

Figure 2C:
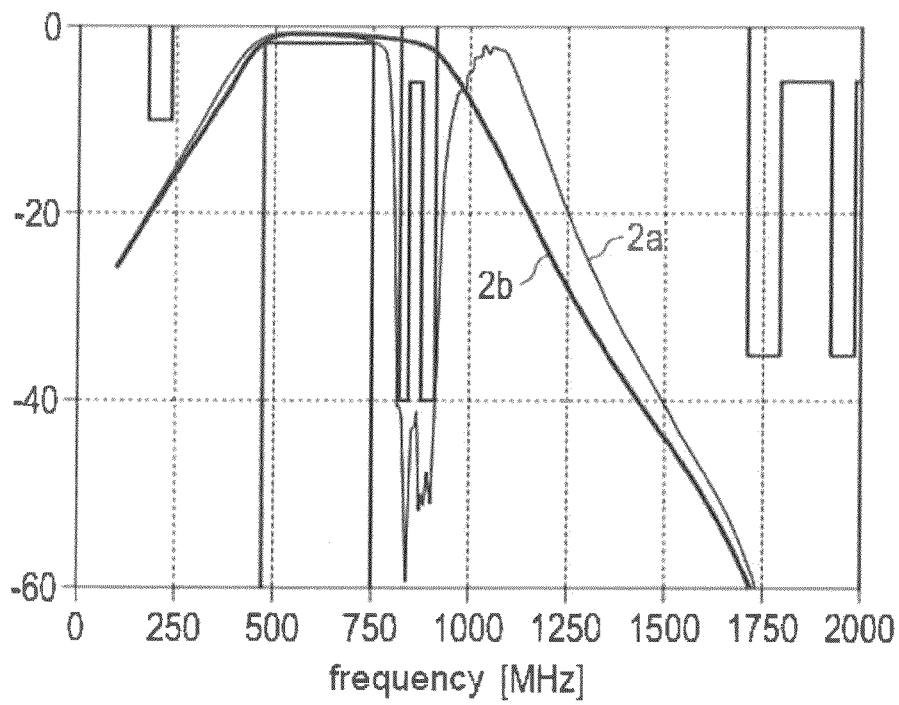
FIG. 2C shows the transmission curves of the filter shown in FIGS. 2A, 2B, FIGS. 3A, 3B show an exemplary embodiment of the transfer function of a resonator of a band rejection filter according to the invention.

FIG. 2C compares simulations according to the exemplary embodiments in FIGS. 2A, 2B. In the diagram, the attenuation in dB is plotted against the frequency in MHz. In this case, the band rejection filter according to FIG. 2A has the passband between approximately 470 MHz and 750 MHz, wherein a first stop band occurs in the subsequent frequency range at approximately 800 MHz to 850 MHz. The transmission curve of the filter shown in FIG. 2A is represented as curve 2a. In particular, a filter embodied in this way has the specification according to FIG. 1.

Curve 2b shows the transmission curve of the simplified filter shown in FIG. 2B. This filter has a passband between approximately 470 MHz and 850 MHz. However, a filter embodied in this way has no band rejection in a range between approximately 800 MHz and 850 MHz.

Figure 3A:
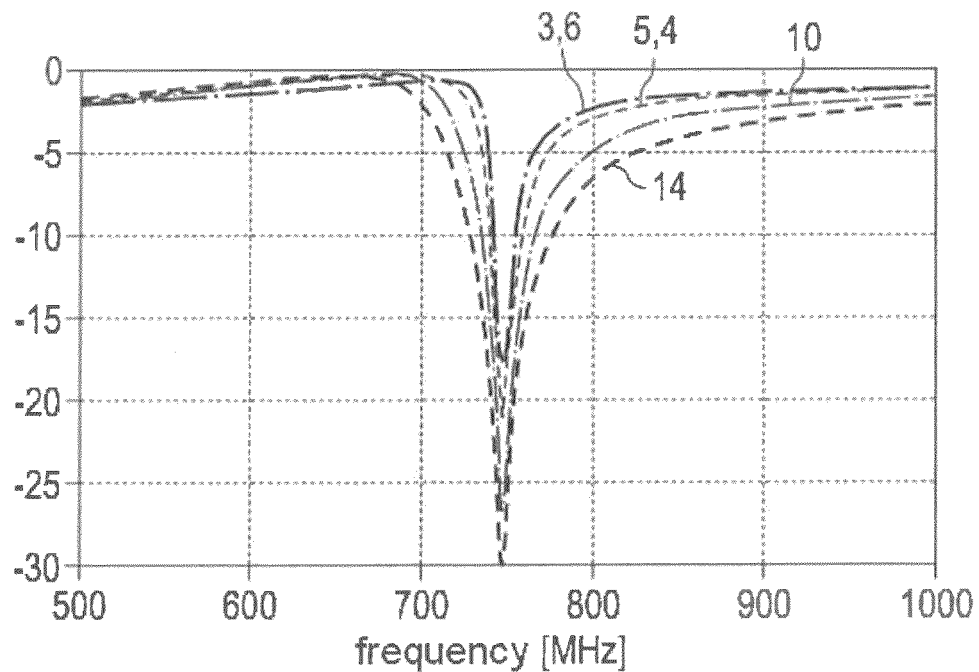

FIG. 3A shows in each case the transfer function of a series resonator with a constant antiresonant frequency but a varied bandwidth. In this respect, the attenuation in dB is plotted against the frequency in MHz. The diagram shows series resonators having different pole-zero spacings. In particular, series resonators having a pole-zero spacing of 3.6%, a pole-zero spacing of 5.4%, a pole-zero spacing of 10% and a pole-zero spacing of 14% are plotted. It is shown here that a higher pole-zero spacing leads to a wider and deeper band rejection, but the steepness of the edge of the passband is reduced. Depending on the respective specification, an optimum pole-zero spacing of the resonators can be used in each case.

Figure 3B:
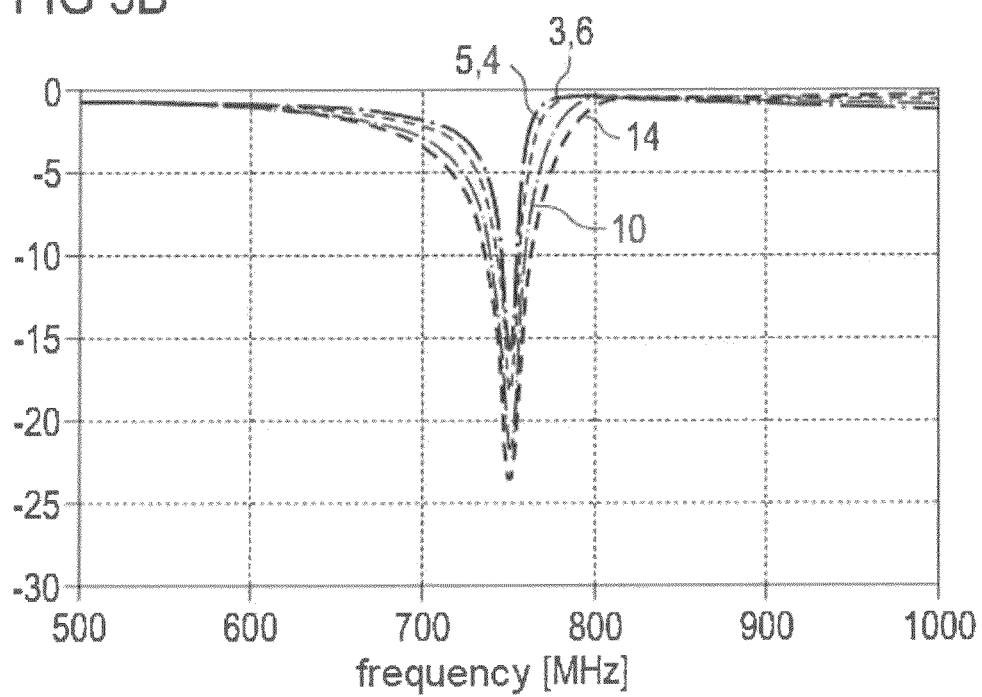

FIG. 3B illustrates the transfer function of a parallel resonator in the circuit diagram with a constant resonant frequency and a varied pole-zero spacing. Transfer function should be understood in this case as the effect of the parallel resonator on the transmission in the serial branch.

In this respect, the attenuation in dB is plotted against the frequency in MHz. In particular, parallel resonators having a pole-zero spacing of 3.6%, 5.4%, 10% and 14% are shown. As in the case of the series resonators in FIG. 3A, a higher pole-zero spacing leads to a wider and deeper band rejection, but at the same time the steepness of the edge of the passband is reduced.

Figure 4:
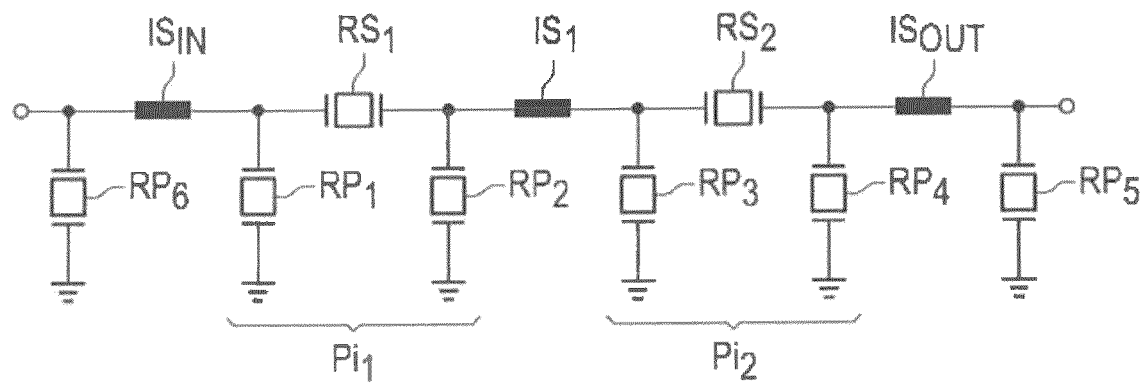
FIG. 4 shows an exemplary embodiment of a band rejection filter in the equivalent circuit diagram in accordance with the prior art.

FIG. 4 shows the circuit diagram of a further configuration of a band rejection filter according to the prior art, for example known from the document EP 2093881 A1, the disclosure content of which is hereby explicitly incorporated by reference in the present application. In comparison with the exemplary embodiment illustrated in FIG. 2A, a respective further parallel resonator RP5, RP6 in a parallel branch connected relative to ground is provided at the input and at the output of the serial connection. By virtue of these additional parallel resonators RP5, RP6, use is made of resonators having a smaller pole-zero spacing of approximately 5.5%. A filter degree of 10 can be achieved with such a band rejection filter.

Figure 5:
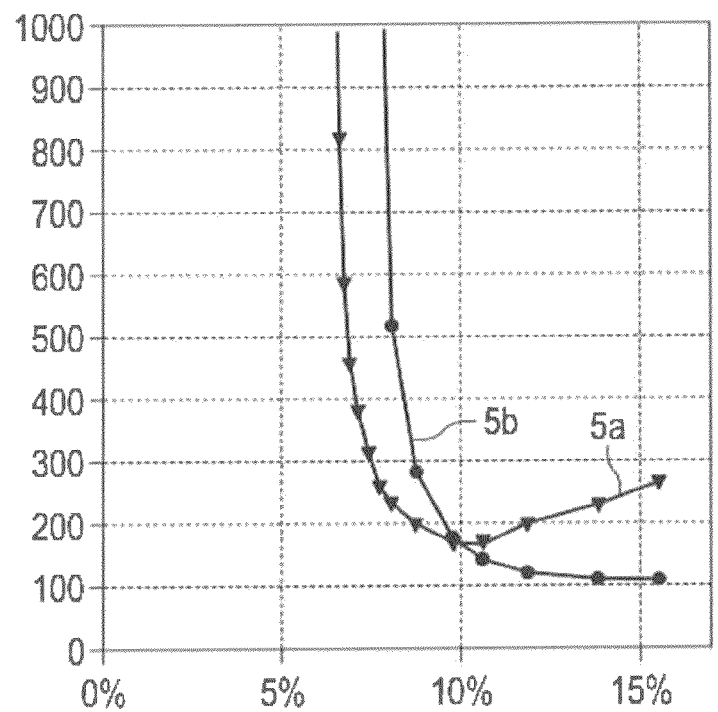
FIG. 5 shows a diagram of the resonator quality factor as a function of the pole-zero spacing of the resonators for an exemplary embodiment of a band rejection filter according to the invention in comparison with the prior art, and FIGS. 6A, 6B each show an exemplary embodiment of a band rejection filter according to the invention comprising offset resonators.

FIG. 5 shows the minimum required resonator quality factor as a function of the pole-zero spacing of the resonators for band rejection filters according to the exemplary embodiments in FIGS. 2A and 4. In this case, curve 5a and curve 5b reproduce the required resonator quality factor as a function of the pole-zero spacing of the resonators for band rejection filters according to FIG. 2A and according to FIG. 4, respectively, if a specification in accordance with FIG. 1 is intended to be fulfilled thereby.

The use of broadband resonators results in a decrease in the requirements in respect of the quality factor in the filter, as a result of which it is possible to realize filters having a lower insertion loss, with at the same time a reduction in the complexity of layout and housing.

FIG. 6A shows a configuration of a band rejection filter according to the invention in which the series resonator RS1 of the first pi-element is offset on the substrate S in a transverse direction Vt relative to the series resonator RS2 of the second pi-element. An occurrence of acoustic coupling of the series resonators RS1, RS2 of the pi-elements can be avoided on account of this offset, as a result of which it is advantageously possible to obtain a high gain in selection in the band rejection filter.

FIG. 6B shows, in comparison with the configuration in FIG. 6A, a configuration of a band rejection filter according to the invention with a corresponding offset of the parallel resonators RP1, RP2 of the first pi-element on the substrate S in a transverse direction relative to the parallel resonators RP3, RP4 of the second pi-element.

The invention has been explained only on the basis of a few exemplary embodiments and is not restricted thereto. Band rejection filters according to the invention are suitable for example for use in future mobile communication terminals in order to decouple an antenna designed for the digital television standard UHF from the Tx band of the nearby GSM800 standard or to protect the television signal against interference signals from this Tx band. Furthermore, it is possible to use band rejection filters according to the invention in receivers for the digital TV standard DVB-T and there, too, to filter out the Tx band from GSM mobile radio devices.

LIST OF REFERENCE SIGNS

DB Passband
SB1,SB2,SB3,SB4 Stop bands
Pi1, Pi2 pi-elements
RP1,RP2,RP3,RP4 Parallel resonators
RP5, RP6 Further parallel resonators
RS1, RS2 Series resonators
IS1 First series inductance
ISIN Second series inductance
ISOUT Third series inductance
S Substrate
Vt Offset of the resonators with respect to one another
2a Transmission curve of the filter from FIG. 2A
2b Transmission curve of the filter from FIG. 2B
5a Resonator quality factor of the filter from FIG. 2A
5b Resonator quality factor of the filter from FIG. 4

The invention claimed is:

1. A band rejection filter comprising: a piezoelectric substrate; and a serial connection of at least two pi-elements which are arranged on the substrate and which each comprise at least two electro-acoustic parallel resonators and at least one electro-acoustic series resonator, wherein the pi-elements are connected by a first series inductance, the serial connection has a second series inductance at an input and a third series inductance at an output, and each of the resonators have a pole-zero spacing of 9%, or more.

2. The band rejection filter according to claim 1, which has a bandwidth of more than 40% in the passband.

3. The band rejection filter according to claim 1, wherein the resonators are SAW resonators.

4. The band rejection filter according to claim 1, wherein the substrate comprises LiNbO3 YX with a cut angle of between 45° and 0°.

5. The band rejection filter according to claim 1, wherein the substrate comprises LiNbO3 with 41XY cut.

6. The band rejection filter according to claim 3, wherein a dielectric layer for passivation is applied to the SAW structures.

7. The band rejection filter according to claim 1, further comprising a housing, in which the substrate with pi-elements arranged thereon is integrated.

8. The band rejection filter according to claim 7, wherein the housing is a 10-pin housing.

9. The band rejection filter according to claim 7, wherein the housing is a 5-pin housing.

10. The band rejection filter according to claim 1, wherein the stop band of the band rejection filter has in total a relative bandwidth of more than 10%.

11. The band rejection filter according to claim 1, wherein the parallel resonators are embodied as SAW resonators without reflectors.

12. The band rejection filter according to claim 1, wherein the series resonators are embodied as SAW resonators without reflectors.

13. The band rejection filter according to claim 1, wherein the resonators are at least partly cascaded.

14. The band rejection filter according to claim 1, wherein the distances between adjacent electrode fingers of at least one parallel resonator embodied as a SAW resonator vary over the length of the resonator.

15. The band rejection filter according to claim 1, wherein the series resonator of the first pi-element is offset in a transverse direction relative to the series resonator of the second pi-element.

16. The band rejection filter according to claim 1, wherein the parallel resonators of the first pi-element are offset in a transverse direction relative to the parallel resonators of the second pi-element.

17. The band rejection filter according to claim 1, wherein the resonant frequencies of the parallel resonators are higher than the resonant frequencies of the series resonators.

18. The use of a band rejection filter according to claim 1 in a communication terminal for mobile radio, which is further designed for reception in a frequency band that transmits video and/or audio data.

* * * * *